US009755178B2

(12) United States Patent
Scharner et al.

(10) Patent No.: US 9,755,178 B2
(45) Date of Patent: Sep. 5, 2017

(54) METHOD FOR FORMING A CONDUCTOR PATH STRUCTURE ON AN ELECTRODE SURFACE OF AN ELECTRONIC COMPONENT

(71) Applicant: OSRAM OLED GmbH, Regensburg (DE)

(72) Inventors: Silke Scharner, Regensburg (DE); Stefan Dechand, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/905,836

(22) PCT Filed: Jun. 13, 2014

(86) PCT No.: PCT/EP2014/062463
§ 371 (c)(1),
(2) Date: Jan. 18, 2016

(87) PCT Pub. No.: WO2015/007439
PCT Pub. Date: Jan. 22, 2015

(65) Prior Publication Data
US 2016/0155981 A1    Jun. 2, 2016

(30) Foreign Application Priority Data

Jul. 18, 2013    (DE) .......................... 10 2013 107 693

(51) Int. Cl.
*B05D 5/12*    (2006.01)
*H01L 51/52*    (2006.01)
(Continued)

(52) U.S. Cl.
CPC ...... *H01L 51/5215* (2013.01); *H01L 51/0022* (2013.01); *H01L 51/445* (2013.01);
(Continued)

(58) Field of Classification Search
USPC .......................................................... 427/99.2
See application file for complete search history.

(56) References Cited

U.S. PATENT DOCUMENTS

2005/0276912 A1    12/2005 Yamamoto et al.
2006/0246695 A1*   11/2006 Kim ........................ H01L 24/81
                                                                         438/584
(Continued)

FOREIGN PATENT DOCUMENTS

CN    102117702 A    7/2011
DE    102004013449 B3    12/2005
(Continued)

OTHER PUBLICATIONS

German Search Report based on Application No. 10 2013 107 693.9(3 Pages) dated Mar. 24, 2014 (Reference Purpose Only).
(Continued)

*Primary Examiner* — Austin Murata
(74) *Attorney, Agent, or Firm* — Viering, Jentschura & Partner mbB

(57) ABSTRACT

Various embodiments may relate to a method for forming a conductor path structure on an electrode surface of an electronic component. The method includes introducing electrically conductive metal particles into an insulating carrier material, producing a mixed composition by mixing the carrier material with the metal particles, applying the mixed composition to the electrode surface, separating the metal particles from the carrier material, allowing the metal particles to become attached to the electrode surface, fixing the metal particles attached to the electrode surface, and curing the carrier material.

10 Claims, 3 Drawing Sheets

(51) Int. Cl.
  *H01L 51/00* (2006.01)
  *H01L 51/44* (2006.01)
  *H05K 3/12* (2006.01)
  *H05K 3/28* (2006.01)
  *H01L 51/56* (2006.01)
  *H05K 1/09* (2006.01)

(52) U.S. Cl.
  CPC ........... *H01L 51/56* (2013.01); *H05K 3/1283* (2013.01); *H05K 3/282* (2013.01); *H01L 51/0027* (2013.01); *H01L 2251/5369* (2013.01); *H05K 1/097* (2013.01); *H05K 2201/0326* (2013.01); *H05K 2203/104* (2013.01); *H05K 2203/1105* (2013.01); *Y02E 10/549* (2013.01)

(56) References Cited

U.S. PATENT DOCUMENTS

2008/0142966 A1* 6/2008 Hirano ................ H01L 21/6835
  257/737
2010/0052163 A1* 3/2010 Ouchi .................. H01L 21/4853
  257/737
2012/0037399 A1* 2/2012 Hsiao .................... H05K 3/323
  174/126.1
2012/0161081 A1 6/2012 Kleine Jaeger et al.
2012/0267147 A1 10/2012 Ingle et al.
2015/0333291 A1* 11/2015 van Lammeren ... H01L 27/3276
  427/553

FOREIGN PATENT DOCUMENTS

| DE | 102006060722 A1 | 4/2008 |
| DE | 102007016081 A1 | 7/2008 |
| DE | 102009060066 A1 | 3/2011 |
| WO | 2004086462 A2 | 10/2004 |
| WO | 2011026852 A1 | 3/2011 |

OTHER PUBLICATIONS

International Search Report based on application No. PCT/EP2014/062463 (3 pages +2 pages english translation) dated Oct. 22, 2014 (for reference purpose only).

* cited by examiner

METHOD FOR FORMING A CONDUCTOR PATH STRUCTURE ON AN ELECTRODE SURFACE OF AN ELECTRONIC COMPONENT

RELATED APPLICATIONS

The present application is a national stage entry according to 35 U.S.C. §371 of PCT application No.: PCT/EP2014/062463 filed on Jun. 13, 2014 which claims priority from German application No.: 10 2013 107 693.9 filed on Jul. 18, 2013, and is incorporated herein by reference in its entirety.

TECHNICAL FIELD

Various embodiments relate to a method for forming a conductor path structure on an electrode surface of an electronic component, for example an optoelectronic component, for example a light-emitting component or a light-receiving component.

BACKGROUND

Light-emitting components, for example light-emitting diodes of organic materials (OLEDs), have as an essential property a homogeneity of the luminous density over the active area of an electrode surface. However, on account of the materials used and/or the small layer thicknesses, the electrode surfaces of an OLED have a relatively high electrical resistance. For an electrode surface formed as an anode, indium-tin oxide (ITO) or aluminum-oxidized zinc oxide (ZnOA:Al) is often used as the material. When there are high current densities, the electrical resistance may cause a voltage drop, which may lead to a considerable inhomogeneity of the luminous density. Especially in lighting applications, which require large, homogeneous luminous surfaces, this is undesired.

In order to improve the homogeneity of the current density on the active area, it is known to use electrically conductive conductor path structures, also known as busbar structures, formed on an electrode surface. The structures are applied under or on the electrode surface, for example the electrode surface formed as an anode, and in the finished state usually have the form of thin, narrow metal strips. The application of such conductor path structures allows the conductivity of the electrode surface to be increased significantly and the homogeneity of the luminous density to be improved. It is known to form the conductor path structures by applying a conductive metal paste over the full surface area of the electrode surface and subsequently etching it in order to form a structuring in the form of multiple paths aligned parallel to one another or in the form of a network structure. Photolithographically structured resist masks may be used for example as etching masks. Large etching plants and a large amount of chemicals are required for the etching, making the application of conductor path structures complex and cost-intensive.

SUMMARY

Various embodiments provide a method for forming a conductor path structure on an electrode surface of an electronic component that is distinguished by reduced complexity and lower costs.

In various embodiments, a method for forming a conductor path structure on an electrode surface of an electronic component may include the following steps: introducing electrically conductive metal particles into an insulating carrier material, producing a mixed composition by mixing the carrier material with the metal particles, applying the mixed composition to the electrode surface, separating the metal particles from the carrier material, allowing the metal particles to become attached to the electrode surface, fixing the metal particles attached to the electrode surface, and curing the carrier material.

The electronic component may include or be an optoelectronic component. The electronic component may include or be a light-emitting component and/or include or be a light-receiving component (for example a solar cell).

By means of the method, a conductor path structure can be applied to an electrode surface, for example an electrode surface formed as an anode, so that an etching process becomes optional. For this, firstly electrically conductive metal particles, for example AlNiCo (aluminum-nickel-cobalt) particles, are introduced into an insulating, electrically non-conductive carrier material. The introduction of the metal particles is followed by a mixing operation, in which the metal particles are distributed in the carrier material so as to obtain a mixed composition by means of which the conductor path structure can be formed. The mixed composition may for example have a pasty consistency, whereby the subsequent application of the mixed composition to the electrode surface can be made easier. The mixed composition is not applied to the electrode surface over the full surface area, but in certain portions, so that a structure, for example a line structure or a network structure, that already has the form of the later conductor paths can already be formed during the application of the mixed composition. The targeted, structured application of the mixed composition to the electrode surfaces is followed firstly by separating the metal particles from the carrier material within the mixed composition, so that the mixed composition applied to the electrode surface is given a heterogeneous form, in which the metal particles are separated from the carrier material within the mixed composition. During the separation of the metal particles from the carrier material, the metal particles become attached to the electrode surface, so that the part of the mixed composition that adjoins the electrode surface consists predominantly of metal particles. Subsequently, the metal particles attached to the electrode surface are fixed, so that the metal particles can no longer be mixed with the carrier material but remain in their position attached to the electrode surface. In order to complete the conductor path structure on the electrode surface, after the fixing of the metal particles on the electrode surface the carrier material is cured, the cured carrier material being able to serve for insulating the metal structure formed by the attached metal particles.

Furthermore, nanoparticles which have a magnetic core (e.g. Fe, Ni, Co, Fe3O4) and an electrically conductive coating (e.g. aluminum or silver) may be used.

SiO2, one or more glass solders (low-refractive and high-refractive), one or more polymers (low-refractive and high-refractive), for example transparent polymers, may be provided for example as the carrier material. Furthermore, epoxy resins, coatings or pastes (for example on a polymer basis) may be provided for example as the carrier material.

Consequently, by this method, a metal structure and an insulating layer that insulates the metal structure and is formed by the cured carrier material can be formed in one method step on the electrode surface by a targeted, structured application of the mixed composition, which contains the metal particles used for forming the later metal structure and the carrier material forming the later insulating layer.

The complexity involved in forming a conductor path structure that is formed by the metal structure and the insulating layer on an electrode surface can be significantly reduced in this way, whereby the costs for the forming of conductor path structures can also be reduced significantly. Since, moreover, an etching process becomes optional, for example becomes unnecessary for forming the conductor path structure, it is no longer necessary to use large etching plants, and the use of chemicals can also be reduced significantly, for example the use of wet chemical processing becoming optional.

In order to simplify the application of the mixed composition to the electrode surface and allow the application of the mixed composition for the forming of the desired structure to be performed with precision, the metal particles may be distributed homogeneously, and consequently particularly uniformly, in the carrier material during the mixing of the metal particles with the carrier material. A so-called speed mixer or an ultraturax may be used for example for the mixing; in these cases it is possible for example to prevent agglomerations of the particles.

The application of the mixed composition to the electrode surface may be performed in such a way that the mixed composition is applied to the electrode surface in multiple paths. The paths may for example be applied to the electrode surface parallel to one another for the forming of a line structure or else in a criss-crossing form for the forming of a network structure. Application over the full surface area, in the case of which the actual structure is only formed after the application by a further method step, for example by an etching process, can be avoided in this way. The application of the mixed composition to the electrode surface in the form of paths allows the type and form of the conductor path structure to be established already during the application of the mixed composition.

The mixed composition may for example be applied to the electrode surface by a printing process. The printing process may make it possible for the mixed composition to be precisely and reliably applied for the forming of the desired form of the later conductor paths. A screen printing process may be used for example as the printing process. Apart from the screen printing process, in various embodiments so-called inkjet printing, dispensing or structured doctor blading may also be used.

The metal particles may be separated from the carrier material within the mixed composition and become attached to the electrode surface by creating a magnetic field. The creation of a magnetic field may be performed for example by positioning a magnet on the surface on the side of the electrode surface that lies opposite the surface on the side of the electrode surface on which the mixed composition has been applied. The created magnetic field can then extend through the electrode surface, so that the metal particles in the mixed composition are guided in the direction of the electrode surface by means of the magnetic field, in that they are attracted to the electrode surface and become deposited there on account of the force of attraction. The use of a magnetic field for separating the metal particles from the carrier material and for allowing the separated metal particles to become attached to the electrode surface makes it unnecessary to use chemicals, for example aggressive chemicals, for this, whereby the entire method for forming a conductor path structure can be performed in a way that is less harmful, for example less environmentally harmful.

Once the metal particles have become attached to the electrode surface, the metal particles are fixed in this attached position. The fixing of the metal particles on the electrode surface may be performed for example by an irradiation process. Depending on the carrier material that is used for the magnetic particles, it may be envisaged in various embodiments to cure the carrier material thermally by an oven process.

Thus, for example, the metal particles may be sedimented at the boundary surface with respect to the substrate by an applied magnetic field. The irradiation/heat exposure allows the carrier material to be cured and the metal particles to be fixed thereby.

In the case of the irradiation process, ultraviolet light may be used. The irradiation may then be performed for example by a mercury-vapor lamp.

In order that the metal particles of the conductor path structures are sufficiently electrically insulated in the upward direction, that is to say away from the electrode surface, the curing of the carrier material may be performed in such a way that in a cured state the metal particles are covered over by the carrier material. This can be achieved for example by the fact that, at the beginning of the curing, the carrier material can be uniformly distributed on the metal structure formed by the metal particles fixed on the electrode surface before the actual curing process begins. Once the metal particles are covered over by the carrier material in the cured state, the carrier material can form a closed insulating layer to cover the metal particles or the metal structure formed by the metal particles, whereby a particularly effective insulating action can be achieved.

The curing of the carrier material may be performed for example by supplying heat. When heat is supplied, the carrier material may first be transformed into a flowable state before it cures, so that a uniform distribution of the carrier material over the metal structure formed by the fixed metal particles can be achieved.

A flow-transformation of edges of the metal structure formed by the (fixed) metal particles may be performed by a reflow process.

Any oven that is conventional per se may be used for the reflow process. The reflow process may be advantageously provided in order that the electrically conductive path is formed out of nanoparticles and is consequently insulated from the organic layers that are later vapor-deposited.

To be able to achieve a particularly good distribution of the metal particles in the carrier material during the mixing of the metal particles with the carrier material, nano metal particles may be used as the metal particles.

The use of nano metal particles may have one or more advantages:
- a denser attachment may be possible, and there may be fewer voids between the particles;
- thin layers with low roughness can be formed; and/or
- fine structures and a uniform distribution of the nanoparticles can be achieved.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and in which specific embodiments in which the invention can be carried out are shown for purposes of illustration. In this respect, directional terminology such as for instance at the top", at the bottom", at the front", at the rear", "front", "rear", etc. is used with reference to the orientation of the FIGURE(s) described. Since components of embodiments may be positioned in a number of different orientations, the directional terminology serves for purposes of illustration and is in no way restrictive. It goes without saying that other embodiments may be used and structural or logical changes made without departing from the scope of protection of the present invention. It goes without saying that the features of the various embodiments described herein by way of example can be combined with one another, unless otherwise specifically stated. The following detailed description is therefore not to be interpreted in a restrictive sense, and the scope of protection of the present invention is defined by the appended claims.

In the course of this description, the terms "connected" and "coupled" are used for describing both a direct connection and an indirect connection and both a direct coupling and an indirect coupling. In the FIGURES, identical or similar elements are provided with identical designations, wherever appropriate.

Figure 1A:
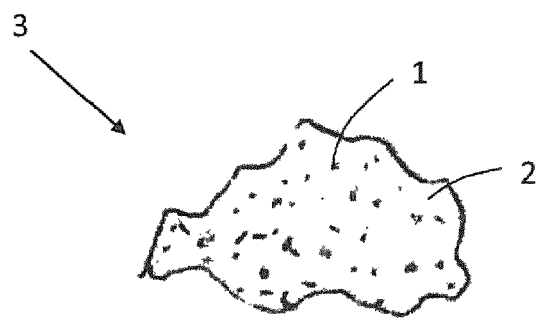
FIG. 1A shows a schematic representation of a mixed composition formed from metal particles and carrier material.

In the case of a method for forming a conductor path structure on an electrode surface, for example an electrode surface formed as an anode, of an electronic component, for example a light-emitting component, for example a light-emitting diode of organic materials (OLED), firstly electrically conductive metal particles 1 are introduced into an (electrically) insulating carrier material 2 and uniformly distributed in the carrier material 2 by mixing, so that a homogeneous mixed composition 3, as shown in FIG. 1A, is formed.

For example, electrically conductive metal particles, for example AlNiCo (aluminum-nickel-cobalt) particles, are introduced into an insulating, electrically non-conductive carrier material. The introduction of the metal particles is followed by a mixing operation, in which the metal particles are distributed in the carrier material so as to obtain a mixed composition by means of which the conductor path structure can be formed. The mixed composition may for example have a pasty consistency, whereby the subsequent application of the mixed composition to the electrode surface can be made easier. The mixed composition is not applied to the electrode surface over the full surface area, but in certain portions, so that a structure, for example a line structure or a network structure, that already has the form of the later conductor paths can already be formed during the application of the mixed composition. The targeted, structured application of the mixed composition to the electrode surfaces is followed firstly by separating the metal particles from the carrier material within the mixed composition, so that the mixed composition applied to the electrode surface is given a heterogeneous form, in which the metal particles are separated from the carrier material within the mixed composition. During the separation of the metal particles from the carrier material, the metal particles become attached to the electrode surface, so that the part of the mixed composition that adjoins the electrode surface consists predominantly of metal particles. Subsequently, the metal particles attached to the electrode surface are fixed, so that the metal particles can no longer be mixed with the carrier material but remain in their position attached to the electrode surface. In order to complete the conductor path structure on the electrode surface, after the fixing of the metal particles on the electrode surface the carrier material is cured, the cured carrier material being able to serve for insulating the metal structure formed by the attached metal particles.

Furthermore, nanoparticles which have a magnetic core (e.g. Fe, Ni, Co, $Fe_3O_4$) and an electrically conductive shell (e.g. aluminum or silver) may be used.

$SiO_2$, one or more glass solders (low-refractive and high-refractive), one or more polymers (low-refractive and high-refractive), for example one or more transparent polymers, may be provided for example as the carrier material. Furthermore, epoxy resins, coatings or pastes on a polymer basis may be provided for example as the carrier material.

The mixing ratio may be for example: volume percentage of nanoparticles [50% [40%–20%]1%] in the carrier material, in order to ensure a sufficient reflow process. The volume percentages relate to the total volume of the substance mixture.

Figure 1B:
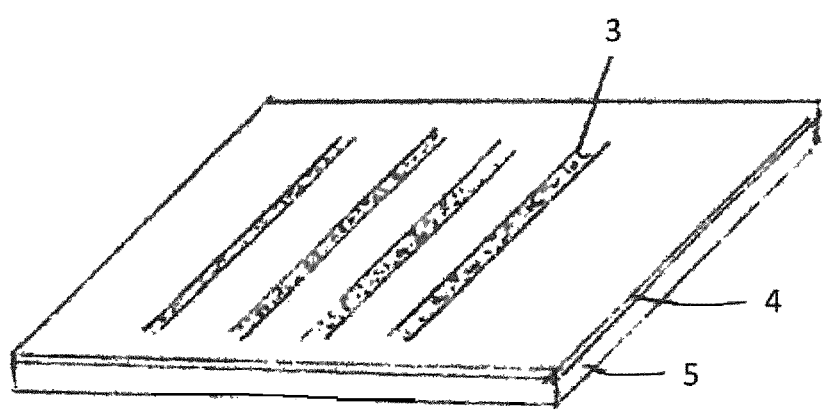
FIG. 1B shows a schematic representation of applied paths of the mixed composition shown in FIG. 1A on an electrode surface.

The homogeneous mixed composition 3, which has for example a pasty consistency, is subsequently applied to an electrode surface 4, as shown in FIG. 1B.

The electrode surface 4, which may for example be formed as a transparent anode of indium-tin oxide (ITO), is arranged over the surface area of a substrate 5. The substrate 5 may for example be a glass substrate.

As shown in FIG. 1B, the mixed composition 3 is applied to the electrode surface 4 in a structured form, for example in multiple paths running parallel to one another, so as to produce a line structure. The mixed composition 3 applied to the electrode surface 4 already has the form of the later conductor path structure, since the mixed composition 3 is not applied to the electrode surface 4 over the full surface area, but in a targeted manner only in the regions where the conductor path structure is also to be formed later. The application may be performed by means of a printing process, for example by means of a screen printing process.

Figure 1C:
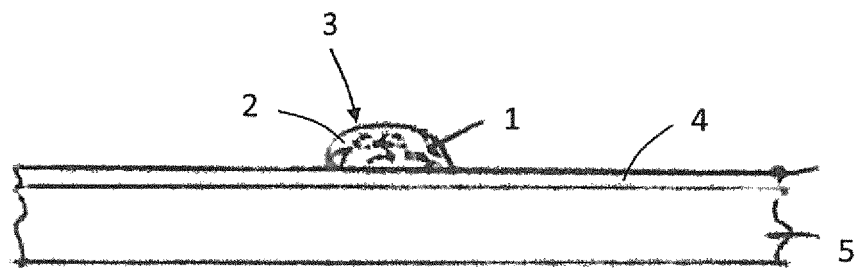
FIG. 1C shows a schematic sectional representation of a path of the mixed composition shown in FIG. 1B on the electrode surface.

FIG. 1C shows the mixed composition 3 of a path shown in FIG. 1B applied to the electrode surface 4 in a sectional representation, the metal particles 1 and the carrier material 2 here still being homogeneously distributed in the mixed composition 3.

Figure 1D:
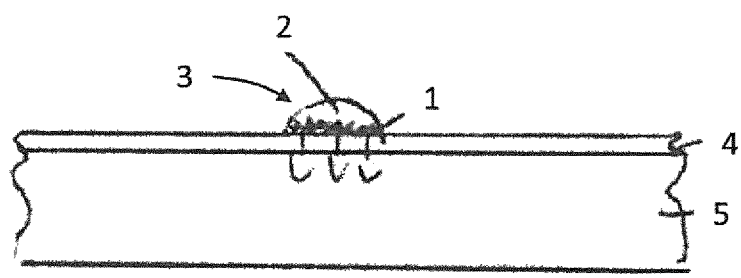
FIG. 1D shows a schematic representation of a method step of separating the metal particles from the carrier material within the mixed composition.
Figure 1D:
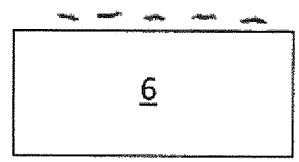

The application of the mixed composition 3 to the electrode surface 4 is followed by a separation of the metal particles 1 from the carrier material 2 within the mixed composition 3 and by the separated metal particles 1 being allowed to become attached to the electrode surface 4. As shown in FIG. 1D, the separation and attachment of the metal particles 1 may be achieved by creating a magnetic field. The creation of a magnetic field is performed by means of a magnet 6, which is positioned underneath the electrode surface and underneath the substrate 5. The magnetic field that is created by the magnet 6 and extends through the substrate 5 and the electrode surface 4 creates an alignment of the metal particles 1 within the mixed composition 3 in the direction of the magnet 6, whereby the metal particles 1 are attracted to the electrode surface 4 and the metal particles 1 thereby become attached to the electrode surface 4.

Once the metal particles 1 of the mixed composition 3 are attached to the electrode surface 4, in a following step the metal particles 1 are fixed on the electrode structure 4, a metal structure that forms the metal structure of the finished conductor path structure already being formed by the fixing.

Figure 1E:
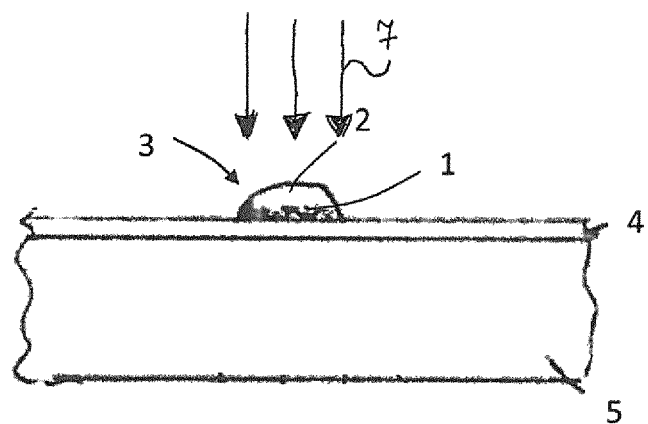
FIG. 1E shows a schematic representation of a method step of fixing the metal particles attached to the electrode surface.

As shown in FIG. 1E by the arrows 7, the fixing may be performed by irradiating the mixed composition 3, it being possible to use ultraviolet light for the irradiation. The irradiation is performed from above the electrode surface 4, and consequently from above the substrate 5, the ultraviolet rays of light that are produced during the irradiation irradiating the mixed composition 3 attached to the electrode surface 4.

The mixed composition 3 may also be cured, it being possible for the curing to be performed by supplying heat. In graphic terms, the metal particles 1 are fixed by means of the curing of the carrier material 2. It should be noted that in various exemplary embodiments the temperature in the course of the curing is still below the glass transition temperature of the carrier material 2. At the beginning of the curing, a uniform distribution of the carrier material 2 over the fixed metal particles 1 formed into a metal structure may first be performed by supplying heat, so that the fixed metal particles 1 are completely covered by the carrier material 2, and as a result the carrier material 2 can form an insulating layer for the fixed metal particles 1 forming the metal structure.

The irradiation may be performed with an intensity (in the case of UV exposure) in an intensity range from approximately 1 J/cm$^2$ to approximately 15 J/cm$^2$, for example in an intensity range from approximately 3 J/cm$^2$ to approximately 8 J/cm$^2$, to be precise for example for a time period in a range from approximately 10 seconds to approximately 300 seconds, for example in a range from approximately 30 seconds to approximately 120 seconds.

Instead of irradiation, in various exemplary embodiments a heat exposure process may be exclusively carried out, for example in an oven, for example at a temperature in a range from approximately 50° C. to approximately 150° C., for example in a range from approximately 80° C. to approximately 130° C., to be precise for example for a time period in a range from approximately 60 seconds to approximately 900 seconds, for example in a range from approximately 120 seconds to approximately 600 seconds.

Subsequently, in various exemplary embodiments a reflow process is carried out, a process in which the glass transition temperature of the carrier material 2 is exceeded, so that a flowing of the carrier material 2 becomes possible. The reflow process may be carried out at a reflow temperature in a range from approximately 100° C. to approximately 260° C., for example in a range from approximately 150° C. to approximately 220° C., to be precise for example for a reflow time period in a range from approximately 600 seconds to approximately 10 800 seconds, the specific time period to be chosen in each case depending on the carrier material. In other words, the reflow process is generally carried out at a temperature that lies above the glass transition temperature of the carrier material 2. Consequently, in graphic terms, the carrier material 2 flows, and makes the edges of the metal structure/metal path undergo a forming process.

Figure 1F:
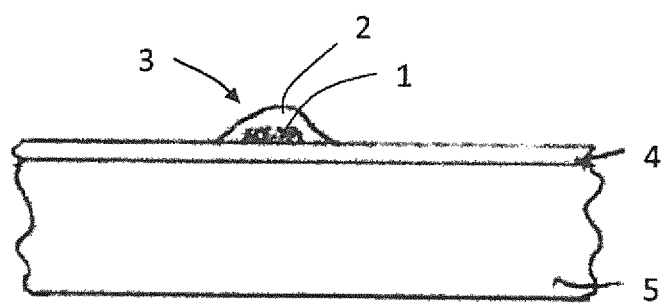
FIG. 1F shows a schematic representation of a completed conductor path structure on the electrode surface after a reflow process.

In FIG. 1F, a completed conductor path structure 8 arranged on the electrode surface 4 is shown, the conductor path structure 8 being formed by the metal structure formed by the metal particles 1 fixed on the electrode surface 4 and the insulating layer formed by the curing of the carrier material 2 that is separated from the metal particles 1.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for forming a conductor path structure on an electrode surface of an electronic component, the method comprising:
   introducing electrically conductive metal particles into an insulating carrier material,
   producing a mixed composition by mixing the carrier material with the metal particles,
   applying the mixed composition to the electrode surface,
   separating the metal particles from the carrier material within the mixed composition,
   allowing the metal particles to become attached to the electrode surface by creating a magnetic field that extends through the electrode surface, so that the metal particles in the mixed composition are guided in the direction of the electrode surface by means of the magnetic field,
   fixing the metal particles attached to the electrode surface, and
   curing the carrier material.

2. The method as claimed in claim 1,
   wherein the metal particles is distributed homogeneously in the carrier material during the mixing of the metal particles with the carrier material.

3. The method as claimed in claim 1,
   wherein the mixed composition is applied to the electrode surface in multiple paths.

4. The method as claimed in claim 1,
   wherein the mixed composition is applied to the electrode surface by a printing process.

5. The method as claimed in claim 1,
   wherein the fixing of the metal particles on the electrode surface is performed by means of an irradiation process.

6. The method as claimed in claim 5,
   wherein ultraviolet light is used in the irradiation process.

7. The method as claimed in claim 1,
   wherein the curing of the carrier material is performed in such a way that in a cured state the metal particles are covered over by the carrier material.

8. The method as claimed in claim 1,
   the curing of the carrier material is performed by supplying heat.

9. The method as claimed in claim 8,
   wherein a flow-transformation of edges of a metal structure formed by the metal particles is by means of a reflow process.

10. The method as claimed in claim 1, wherein nano metal particles are used as the metal particles.

* * * * *